US012559325B2

(12) United States Patent
Tashiro et al.

(10) Patent No.: US 12,559,325 B2
(45) **Date of Patent: *Feb. 24, 2026**

(54) TRANSFER ROBOT

(71) Applicant: KABUSHIKI KAISHA YASKAWA DENKI, Kitakyushu (JP)

(72) Inventors: Akihiro Tashiro, Kitakyushu (JP); Kyohei Tsuchiya, Kitakyushu (JP); Chengbi Zhao, Kitakyushu (JP); Ikuro Hirata, Kitakyushu (JP); Keisuke Yonehara, Kitakyushu (JP)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 117 days.

This patent is subject to a terminal disclaimer.

(21) Appl. No.: 18/462,429

(22) Filed: Sep. 7, 2023

(65) Prior Publication Data

US 2024/0116719 A1      Apr. 11, 2024

(30) Foreign Application Priority Data

Oct. 5, 2022     (JP) ................................. 2022-161274

(51) Int. Cl.
*B25J 9/04* (2006.01)
*B65G 47/90* (2006.01)
*H01L 21/677* (2006.01)
*H01L 21/687* (2006.01)

(52) U.S. Cl.
CPC ............ *B65G 47/905* (2013.01); *B25J 9/042* (2013.01); *H01L 21/67742* (2013.01); *H01L 21/67766* (2013.01); *H01L 21/68707* (2013.01)

(58) Field of Classification Search
CPC ..... B25J 9/042; B25J 9/043; H01L 21/67742; H01L 21/67766; H01L 21/68707
See application file for complete search history.

(56) References Cited

U.S. PATENT DOCUMENTS

| | | | | |
|---|---|---|---|---|
| 4,629,860 A | * | 12/1986 | Lindbom | ............... B25J 18/007 901/42 |
| 9,975,239 B2 | * | 5/2018 | Kinoshita | ............. B25J 9/0024 |
| 10,029,369 B1 | * | 7/2018 | Carlisle | ................... B25J 9/042 |
| 12,427,653 B2 | * | 9/2025 | Tashiro | ................. B25J 9/0093 |
| 2005/0234327 A1 | * | 10/2005 | Saracen | ................ A61B 6/548 600/407 |
| 2008/0213077 A1 | * | 9/2008 | Tanaka | ................. B66C 1/0256 414/744.8 |

(Continued)

FOREIGN PATENT DOCUMENTS

| | | | | |
|---|---|---|---|---|
| JP | 2020-163516 | 10/2020 | | |
| WO | WO-2017098544 A1 | * | 6/2017 | ............. A61G 13/02 |

*Primary Examiner* — Gerald McClain

(74) *Attorney, Agent, or Firm* — MORI & WARD, LLP

(57) ABSTRACT

A transfer robot includes a first arm provided rotatably around a first axis which extends along a vertical direction, a second arm connected to the first arm rotatably around a second axis which extends along the vertical direction, an arm distal end portion which is configured to be connected to a workpiece holder to hold a workpiece and which is connected to the second arm rotatably around a third axis which extends along the vertical direction, and a posture adjuster configured to rotate the workpiece around a first posture adjustment axis which intersects both the third axis and a direction extending toward the arm distal end portion away from the third axis.

15 Claims, 8 Drawing Sheets

(56)  References Cited

U.S. PATENT DOCUMENTS

| | | | |
|---|---|---|---|
| 2013/0116821 A1* | 5/2013 | Joly | G05B 19/4086 |
| | | | 700/254 |
| 2015/0104283 A1* | 4/2015 | Nogami | B25J 18/00 |
| | | | 414/730 |
| 2018/0221904 A1* | 8/2018 | Yoshino | B25J 9/042 |
| 2018/0354136 A1* | 12/2018 | Carlisle | B25J 13/085 |
| 2019/0298276 A1* | 10/2019 | Pinault | A61B 6/4458 |
| 2019/0374417 A1* | 12/2019 | Hiratsuka | A61G 13/06 |
| 2020/0306962 A1 | 10/2020 | Kawai | |
| 2022/0104984 A1* | 4/2022 | Keller | A61G 13/04 |
| 2023/0339100 A1* | 10/2023 | Tashiro | B25J 9/0093 |
| 2024/0227210 A1* | 7/2024 | Embertson | B25J 19/0091 |

* cited by examiner

TRANSFER ROBOT

CROSS-REFERENCE TO RELATED APPLICATIONS

The present application claims priority under 35 U. S. C. § 119 to Japanese Patent Application No. 2022-161274, filed Oct. 5, 2022. The contents of this application are incorporated herein by reference in their entirety.

BACKGROUND OF THE INVENTION

Field of the Invention

The present disclosure relates to a transfer robot.

Discussion of the Background

Japanese Patent Application Laid-Open No. 2020-163516 discloses a horizontal articulated robot used for work such as holding, conveying, assembling, and inspecting a workpiece.

SUMMARY OF THE INVENTION

According to one aspect of the present disclosure, a transfer robot includes a first arm provided rotatably around a first axis which extends along a vertical direction; a second arm connected to the first arm rotatably around a second axis which extends along the vertical direction; an arm distal end portion which is configured to be connected to a workpiece holder to hold a workpiece and which is connected to the second arm rotatably around a third axis which extends along the vertical direction; and a posture adjuster configured to rotate the workpiece around a first posture adjustment axis which intersects both the third axis and a direction extending toward the arm distal end portion to be away from the third axis.

According to another aspect of the present disclosure, a transfer robot includes a first arm provided rotatably around a first axis which extends along a vertical direction; a second arm connected to the first arm rotatably around a second axis which extends along the vertical direction; a posture adjuster connected to the second arm rotatably around a third axis which extends along the vertical direction; and an arm distal end portion fixed to the posture adjuster and connected to a workpiece holder to hold a workpiece. The posture adjuster is configured to rotate the workpiece holder around a first posture adjustment axis which intersects both the third axis and a direction extending toward the arm distal end portion away from the third axis.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings.

DESCRIPTION OF THE EMBODIMENTS

Figure 1:
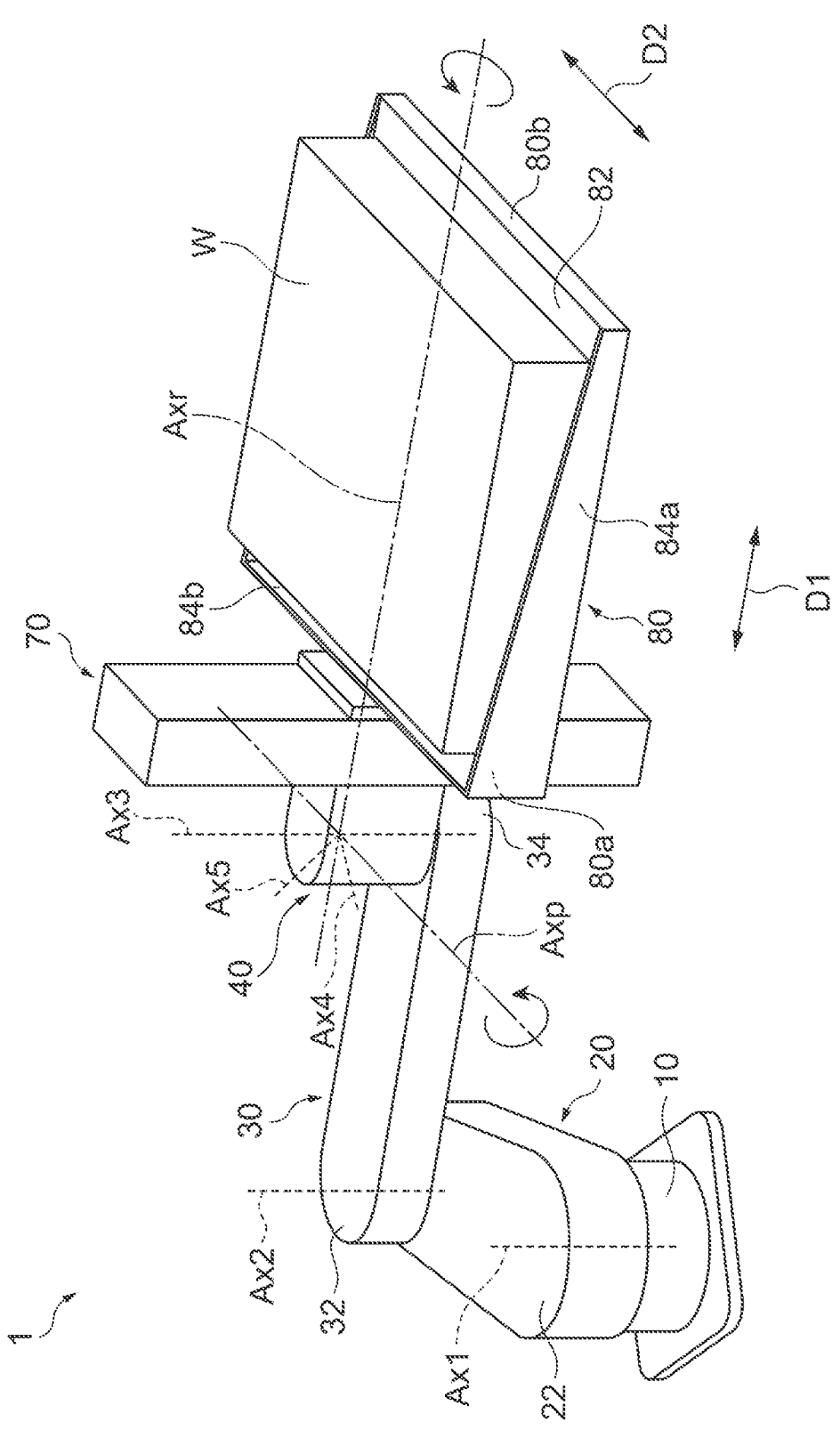
FIG. 1 is a perspective view schematically showing an example of a transfer robot.

Hereinafter, embodiments will be described with reference to the drawings. In the description, the same element or an element having the same function is denoted by the same reference numeral, and redundant description is omitted. In addition, although expressions such as "parallel", "orthogonal", "horizontal", and "vertical" are used in the following embodiments, it is not necessary to strictly satisfy these states. That is, each expression described above allows a deviation due to manufacturing accuracy, installation accuracy, processing accuracy, detection accuracy, deformation of a mechanical structure, or the like.

Figure 2A:
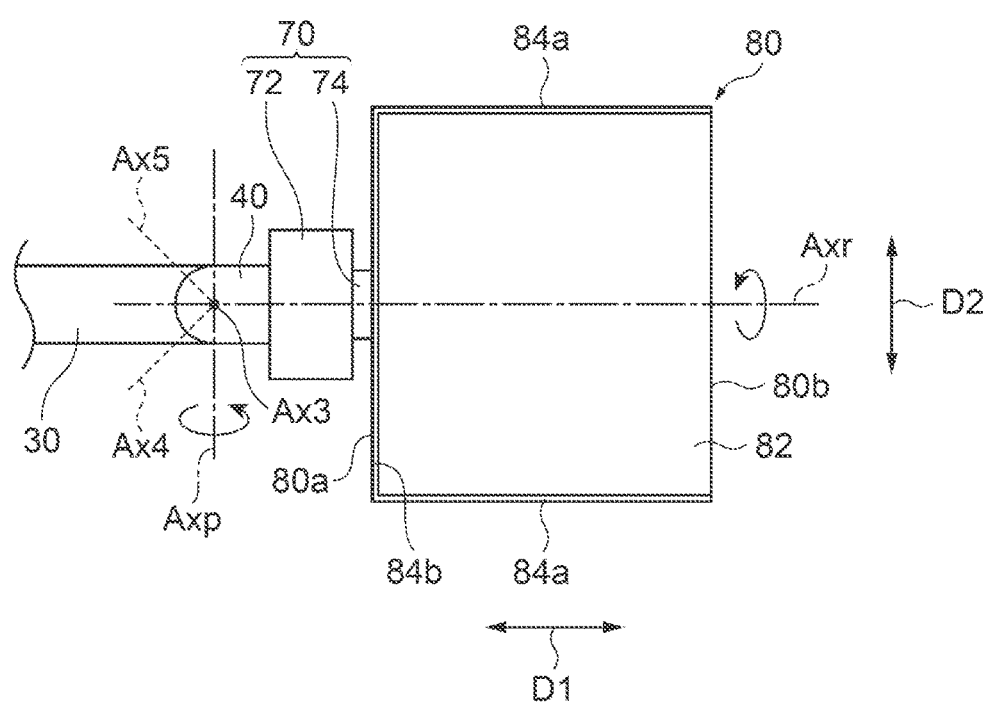
FIG. 2A is a top view schematically showing an example of the transfer robot.

FIG. 1 is a perspective view illustrating the configuration of the transfer robot 1. FIG. 2Aa is a top view (plan view) illustrating the configuration of the transfer robot 1, and FIG. 2Bb is a side view illustrating the configuration of the transfer robot 1. The transfer robot 1 shown in FIG. 1 is configured to transfer an object to be transferred (hereinafter referred to as a "workpiece W"). The transfer robot 1 automatically executes at least a part of operations including the transfer of the workpiece W. The transfer robot 1 may perform at least a part of the work on the workpiece W in cooperation with a device such as another robot or a worker. A controller is connected to the transfer robot 1, and the transfer robot 1 is controlled by, for example, the controller to receive the workpiece W and transfer the workpiece W to a target position.

The type of the workpiece W to be transferred by the transfer robot 1 is not particularly limited. The weight of the workpiece W may be equal to or greater than 300 kg, equal to or greater than 450 kg, or equal to or greater than 600 kg. That is, the weight capacity of the transfer robot 1 may be equal to or greater than 300 kg, equal to or greater than 450 kg, or equal to or greater than 600 kg. The workpiece W may include a battery module for traveling of an electric vehicle. The workpiece W may be a single battery module, or may be a plurality of battery modules that are collectively conveyed. Further, the workpiece W may be a battery unit in which a plurality of battery modules is integrated. The transfer robot 1 may transport (transfer) the workpiece W to a shelf on which a plurality of cells is vertically arranged, or may lift the workpiece W from below and transport the workpiece W to an attachment position of another workpiece to which the workpiece W is attached.

The transfer robot 1 holds the workpiece W and transfers the workpiece W. In one example, the transfer robot 1 is configured to change the position of the workpiece W on the horizontal plane and the posture of the workpiece W while supporting the workpiece W from below. The transfer robot 1 may be capable of changing the position (height position) of the workpiece W also in the vertical direction. As illustrated in FIG. 1, the transfer robot 1 includes, for example, a base 10, a first arm 20, a second arm 30, an arm distal end portion 70, a workpiece holding unit (an example of "a workpiece holder") 80, and a posture adjustment unit (an example of "a posture adjuster") 40.

The base 10 is a base part fixed in a predetermined position. The base 10 supports other members such as an arm included in the transfer robot 1. The base 10 is fixed to, for example, a floor surface or a wall surface. When the base 10 is fixed to a predetermined position such as a floor surface, the transfer robot 1 is fixed in a region where working operation is performed on the workpiece W. In the case where the base 10 is fixed to a floor surface, the floor surface may be horizontal (may be orthogonal to the vertical direction).

The first arm 20 is provided so as to rotate around a vertical first axis Ax1. The first axis Ax1 is an axis extending in the vertical direction (up-down direction), and the first arm 20 is rotatable about the first axis Ax1. The proximal end 22 of the first arm 20 may be provided at (e.g., mounted on) the base 10). The first arm 20 extends in a direction away from the first axis Ax1. The first arm 20 extends, for example, along a horizontal line in a direction away from the first axis Ax1. The first axis Ax1 may be set to pass through the base 10 and the proximal end 22.

The second arm 30 is provided on the first arm 20 so as to rotate around a vertical second axis Ax2. The second arm 30 may be provided at a portion of the first arm 20 closer to the distal end portion 24, for example, at the distal end portion 24 of the first arm 20. The second axis Ax2 is an axis extending in the vertical direction, and the second arm 30 is rotatable around the second axis Ax2 with respect to the first arm 20. The proximal end 32 of the second arm 30 may be mounted over the distal end portion 24 of the first arm 20. The second arm 30 extends in a direction away from the second axis Ax2. The second arm 30 extends, for example, along a horizontal line in a direction away from the second axis Ax2. The second axis Ax2 may be set to pass through the distal end portion 24 and the proximal end 32 of the first arm 20.

The arm distal end portion 70 is configured to support workpiece holding unit 80. The arm distal end portion 70 is connected to the second arm 30 so as to rotate about a vertical third axis Ax3. The third axis Ax3 is an axis extending in the vertical direction, and the arm distal end portion 70 is rotatable around the third axis Ax3 with respect to the second arm 30. The arm distal end portion 70 may be disposed closer to the distal end portion 34 of the second arm 30, and is connected to the distal end portion 34 of the second arm 30, for example. The arm distal end portion 70 may be connected to the distal end portion 34 of the second arm 30 via the posture adjustment unit 40. The third axis Ax3 may be set so as to pass through the distal end portion 34 of the second arm 30 and the posture adjustment unit 40 without passing through the arm distal end portion 70. The arm distal end portion 70 may be disposed at a position away from the third axis Ax3.

Figure 2B:
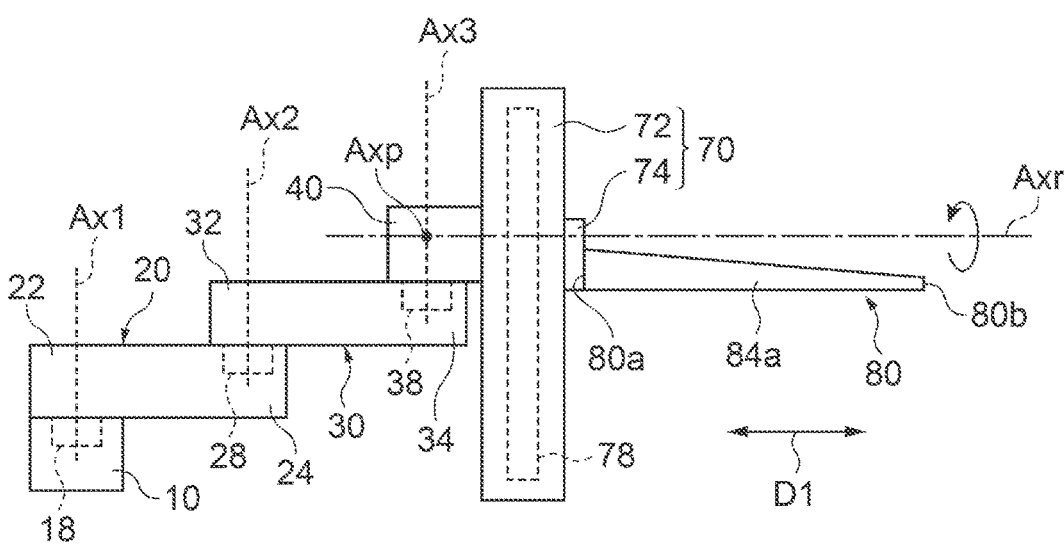
FIG. 2B is a side view schematically illustrating an example of the transfer robot.

As shown in FIGS. 2A and 2B, the arm distal end portion 70 includes, for example, an lifting base portion 72 and a movable portion 74. The lifting base portion 72 is a portion connected to (supported by) the posture adjustment unit 40. The lifting base portion 72 is formed to extend in a direction intersecting the extending direction of the second arm 30. The extending direction of the second arm 30 is defined as a direction in which a line segment connecting the second axis Ax2 and the third axis Ax3 with the shortest distance extends. As will be described later, the posture of the arm distal end portion 70 is also changed by the posture adjustment unit 40. Therefore, the direction in which the lifting base portion 72 extends (the extending direction of the lifting base portion 72) may substantially coincide with the vertical direction or may be inclined with respect to the vertical direction.

When the extending direction of the lifting base portion 72 is inclined with respect to the vertical direction, the angle formed by the extending direction of the lifting base portion 72 and the vertical direction is 30° or less, 20° or less, 15° or less, or 10° or less. A state in which the posture of the arm distal end portion 70 is not adjusted by the posture adjustment unit 40 and the workpiece holding unit 80 does not hold the workpiece W (hereinafter referred to as a "reference state") is referred to as a "reference state". In this case, the lifting base portion 72 may extend in a vertical direction. In the reference state, the center of the lifting base portion 72 may be positioned on a line along the extending direction of the second arm 30 when viewed from above. When the arm distal end portion 70 rotates about the third axis Ax3 from the reference state, the line extending from the third axis Ax3 toward the center of the lifting base portion 72 may intersect the line along the extending direction of the second arm 30 when viewed from above.

The height of the uppermost position (the uppermost position) of the lifting base portion 72 may be higher than the uppermost position of the second arm 30. The height of the lowermost position (the lowest position) of the lifting base portion 72 may be lower than the lowermost position of the second arm 30. The height of the lowermost position of the lifting base portion 72 may be lower than the lowermost position of the first arm 20. In the present disclosure, "height" means a position (height position) in the vertical direction. In the vertical direction, at least a portion of the lifting base portion 72 may be positioned at the same height as at least a portion of the second arm 30, and may be positioned at the same height as at least a portion of the first arm 20. The height relationship between the lifting base portion 72 and the other members is defined in a state where the arm distal end portion 70 is disposed such that the extending direction of the lifting base portion 72 substantially coincides with the vertical direction.

The lifting base portion 72 may be disposed on the side of (around) the distal end portion 34 of the second arm 30. In this case, in a plan view (viewed from above), the lifting base portion 72 and the distal end portion 34 do not overlap each other, and at least a part of the distal end portion 34 and at least a part of the lifting base portion 72 are positioned at the same height as each other. The movable portion 74 is a portion that supports the workpiece holding unit 80. For example, the movable portion 74 supports the workpiece holding unit 80 such that the workpiece holding unit 80 is disposed on a side of the arm distal end portion 70. The movable portion 74 is provided on the lifting base portion 72 in order to move along the direction in which the lifting base portion 72 extends. The movable portion 74 is movable along the extending direction of the lifting base portion 72.

The transfer robot 1 includes a first actuator 18. The first actuator 18 is disposed on the base 10, for example, and rotate the first arm 20 around the first axis Ax1 with respect to the base 10. The first actuator 18 includes a motor and a reduction gear. The first actuator 18 may be disposed at any position of the transfer robot 1 as long as they can rotate the first arm 20 about the first axis Ax1. The first actuator 18 may be disposed on the first arm 20, for example. The first actuator 18 may include a transmission member such as a gear and a belt.

The transfer robot 1 includes a second actuator 28. The second actuator 28 is disposed on the first arm 20, for example, and rotate the second arm 30 about the second axis Ax2 with respect to the first arm 20. The second actuator 28 includes a motor and a speed reducer. The second actuator 28 may be disposed at any positions of the transfer robot 1 as long as they can rotate the second arm 30 about the second axis Ax2. The second actuator 28 may be disposed on the second arm 30, for example. The second actuator 28 may include a transmission member such as a gear and a belt.

The transfer robot 1 includes a third actuator 38. The third actuator 38 is disposed on the second arm 30, for example, and rotate the posture adjustment unit 40 (the posture adjustment unit 40, the arm distal end portion 70, and the workpiece holding unit 80) about the third axis Ax3 with respect to the second arm 30. The third actuator 38 includes a motor and a speed reducer. The position of the third actuator 38 is not limited to the second arm 30, and the third actuator 38 may be disposed at any portion of the transfer robot 1 as long as the posture adjustment unit 40 can be rotated about the third axis Ax3. The third actuator 38 may be disposed in, for example, the posture adjustment unit 40. The third actuator 38 may include a transmission member such as a gear and a belt.

The arm distal end portion 70 includes a linear motion driving unit 78. The linear motion driving unit 78 is disposed on the lifting base portion 72 and is a mechanism that drives the movable portion 74 along the direction in which the lifting base portion 72 extends. The linear motion driving unit 78 is, for example, a linear actuator, and includes a ball screw, a rack and pinion, or a linear motor. When the movable portion 74 is driven by the linear motion driving unit 78, the workpiece holding unit 80 (the workpiece W held by the workpiece holding unit 80) moves along the extending direction of the lifting base portion 72. In the present disclosure, the movement along the extending direction of the lifting base portion 72 may be referred to as "lifting".

The workpiece holding unit 80 is an end effector that holds the workpiece W at a position different from the third axis Ax3. The workpiece holding unit 80 is also referred to as a hand. In a plan view, the workpiece W held by the workpiece holding unit 80 does not overlap the third axis Ax3. The workpiece holding unit 80 may be configured in any manner as long as it can hold the workpiece W. FIG. 1 and the like illustrate the workpiece holding unit 80 that holds the workpiece W by supporting the workpiece W from below. The workpiece holding unit 80 may hold (for example, grip) the workpiece W from above. The workpiece holding unit 80 illustrated in FIG. 1 and the like extends in a direction away from the third axis Ax3 while being connected to (supported by) the arm distal end portion 70.

In the transfer robot 1 illustrated in FIG. 1 and the like of the present disclosure, a direction in which the workpiece holding unit 80 extends away from the third axis Ax3 is defined as an extending direction of the workpiece holding unit 80 and is referred to as a "direction D1". The direction D1 may be orthogonal to the extending direction of the lifting base portion 72. Among both end portions of the workpiece holding unit 80 in the extending direction (direction D1), the end portion closer to the third axis Ax3 is referred to as an "end portion 80a", and the end portion farther from the third axis Ax3 is referred to as an "end portion 80b". The end portion 80a is the proximal end of the workpiece holding unit 80, and the end portion 80b is the distal end of the workpiece holding unit 80. The direction D1 corresponds to a direction from the end portion 80a toward the end portion 80b of the workpiece holding unit 80.

The workpiece holding unit 80 may be provided on a side of the arm distal end portion 70. In this case, at least the lifting base portion 72 of the arm distal end portion 70 and the workpiece holding unit 80 do not overlap each other in a plan view. The workpiece holding unit 80 includes at least a bottom portion capable of supporting the workpiece W from below. When the workpiece W has a rectangular parallelepiped shape, the bottom portion of the workpiece holding unit 80 may support a surface having the largest area of the workpiece W. In one example, the workpiece holding unit 80 includes a bottom portion 82, a pair of side walls 84a, and a side walls 84b.

The bottom portion 82 is formed in a plate shape and includes an upper surface orthogonal to the extending direction of the lifting base portion 72. When the workpiece W is placed on the upper surface of the bottom portion 82, the bottom portion 82 (workpiece holding unit 80) supports the workpiece W. The bottom portion 82 (the upper surface of the bottom portion 82) is formed in a rectangular shape. In this case, the bottom portion 82 (the upper surface of the bottom portion 82) is arranged in a direction D1 and a direction perpendicular to the direction D1 (hereinafter referred to as a "direction D2"). The direction D2 is a direction orthogonal to the direction D1 and along the upper surface of the bottom portion 82. One side edge (side surface) of the rectangular bottom portion 82 extending in the direction D2 is connected to the movable portion 74 of the arm distal end portion 70. For example, a central portion of the side edge (side surface) in the direction D2 is supported by the movable portion 74.

The pair of side walls 84a respectively protrude upward from a pair of side edges of the bottom portion 82 along the direction D1. The pair of side walls 84a restricts movement of the workpiece W in the direction D2. The sidewall 84b protrudes upward from a side edge positioned at the end portion side 80a of a pair of side edges of the bottom portion 82 along the direction D2. Among the pair of side edges along the direction D2, the side edge located at the end portion 80b is not provided with any side walls. The sidewall 84b restricts movement of the workpiece W from the end portion 80b toward the end portion 80a.

Returning to FIG. 1, the posture adjustment unit 40 is a part that adjusts the posture of the workpiece W held by the workpiece holding unit 80. The posture of the workpiece holding unit 80 (the posture with respect to the base 10) is adjusted by the posture adjustment unit 40, whereby the posture of the workpiece W held by the workpiece holding unit 80 is adjusted. The posture adjustment unit 40 may be provided between the second arm 30 and the arm distal end portion 70. For example, the posture adjustment unit 40 is provided at the distal end portion 34 of the second arm 30 so as to be rotatable about the third axis Ax3 with respect to the second arm 30. The posture adjustment unit 40 is rotatable about the third axis Ax3.

The posture adjustment unit 40 may be disposed at a height different from that of the first arm 20. The posture adjustment unit 40 may be provided on the second arm 30 (for example, a portion of the second arm 30 closer to the distal end portion 34, or the distal end portion 34. The lowermost position of the posture adjustment unit 40 may be higher than the uppermost position of the first arm 20.

The posture adjustment unit 40 rotates the workpiece W about a first posture adjustment axis Axp which intersects both the third axis Ax3 and a direction extending to the arm distal end portion 70 so as to be away from the third axis Ax3. The crossing in the present disclosure includes a twisted relationship such as a so-called three dimensional crossing. The direction in which the arm distal end portion 70 extends away from the third axis Ax3 corresponds to, for example, a direction in which a line segment connecting the third axis Ax3 and the center of the arm distal end portion 70 (for example, the center of the lifting base portion 72 at the shortest distance extends. For example, the first posture adjustment axis Axp is set to be orthogonal to the direction D1 and orthogonal to the third axis Ax3. In this case, the first posture adjustment axis Axp extends perpendicularly to a plane including the third axis Ax3 and the direction D1 (defined by the third axis Ax3 and the direction D1).

The first posture adjustment axis Axp may be set so as to pass through the posture adjustment unit 40, and may intersect with the third axis Ax3 so as to have an intersection point, for example. When the arm distal end portion 70 rotates around the first posture adjustment axis Axp with respect to the posture adjustment unit 40, the inclination of the direction D1 changes. As a result, the posture (angle) of the workpiece W held by the workpiece holding unit 80 around the first posture adjustment axis Axp changes.

The movable range of the workpiece W (workpiece holding unit 80) about the first posture adjustment axis Axp may be within ±30°. The movable range is, for example, a range in which an angle formed by a plane orthogonal to the third axis Ax3 and the direction D1 changes. The movable range about the first posture adjustment axis Axp may be within ±20°, within ±15°, or within ±10°. In the transfer robot 1 illustrated in FIG. 1 and the like, when the movable range is a positive range, the lower end of the end portion 80a is higher than the lower end of the end portion 80b, and when the movable range is a negative range, the lower end of the end portion 80a is lower than the lower end of the end portion 80b. The magnitude of the absolute value of the angle in the positive range and the magnitude of the absolute value of the angle in the negative range may be different from each other.

The posture adjustment unit 40 may further rotate the workpiece W about a second posture adjustment axis Axr intersecting both the first posture adjustment axis Axp and the third axis Ax3. The second posture adjustment axis Axr is, for example, orthogonal to the first posture adjustment axis Axp and intersects the third axis Ax3. The second posture adjustment axis Axr is substantially parallel to the direction D1. The second posture adjustment axis Axr may be set so as to pass through the posture adjustment unit 40, and is set so as to pass through an intersection point of the third axis Ax3 and the first posture adjustment axis Axp, for example. The first posture adjustment axis Axp and the second posture adjustment axis Axr may intersect with each other so as to have an intersection point at a position away from the third axis Ax3.

In a plan view, as shown in FIG. 2A, the second posture adjustment axis Axr may be set to pass through the third axis Ax3 and the center of the arm distal end portion 70 in the direction D2 in the reference state. When the arm distal end portion 70 rotates around the second posture adjustment axis Axr with respect to the posture adjustment unit 40, the inclination of the direction D2 changes. As a result, the posture (angle) of the workpiece W held by the workpiece holding unit 80 around the second posture adjustment axis Axr changes.

The movable range of the workpiece W (workpiece holding unit 80) about the second posture adjustment axis Axr may be within ±30°. The movable range is a range in which an angle formed by a plane orthogonal to the third axis Ax3 and the direction D2 changes. The movable range around the second posture adjustment axis Axr by the posture adjustment unit 40 may be within ±20°, within ±15°, or within ±10°. When the movable range is a plus range, the lower end of the right end portion (the other end portion in the direction D2) of the workpiece holding unit 80 is higher than the lower end of the left end portion (the one end portion in the direction D2), and when the movable range is a minus range, the lower end of the right end portion of the workpiece holding unit 80 is lower than the lower end of the left end portion.

In the transfer robot 1, a portion (the base 10, the first arm 20, the second arm 30, and the arm distal end portion 70) other than the posture adjustment unit 40 and the workpiece holding unit 80 is a selective compliance assembly robot arm (SCARA) type articulated arm. The transfer robot 1 has a function of adjusting the posture of the workpiece holding unit 80 by including the posture adjustment unit 40 in addition to a function of changing the position of the workpiece holding unit 80 by the scalar type articulated arm portion.

Here, it is assumed that the posture is not adjusted by the posture adjustment unit 40. When the workpiece W is not held (supported) by the workpiece holding unit 80, for example, the direction D1 and the direction D2 are maintained in a horizontal state. When the workpiece W is placed on the workpiece holding unit 80, the direction D1 can be inclined with respect to the horizontal line by the weight of the workpiece W such that the lower end of the end portion 80b is lower than the lower end of the end portion 80a. When the workpiece W has a weight equal to or greater than 300 kg, the inclination of the direction D1 caused by the own weight of the workpiece W becomes significant. The direction D2 may also be inclined with respect to the horizontal line due to the own weight of the workpiece W.

The posture adjustment unit 40 operates to maintain the posture of the workpiece W at the target posture. The target posture of the workpiece W is set to, for example, a horizontal posture. The posture adjustment unit 40 may operate so as to reduce the inclination of the direction D1 caused by the own weight of the workpiece W (so as to correct the inclination of the direction D1). The posture adjustment unit 40 may operate to reduce the inclination of the direction D1 (to correct the inclination of the direction D2) in addition to the inclination of the direction D2.

In an example, at a stage of teaching an operation to the transfer robot 1, an operator or the like measures the inclination of the workpiece W (for example, the inclination in each of the direction D1 and the direction D2) in a state where the workpiece holding unit 80 holds the workpiece W without adjusting the posture by the posture adjustment unit 40. Then, while changing the driving amount by the posture adjustment unit 40, the operator or the like stores the driving amount by which the workpiece W (for example, the direction D1 and the direction D2) becomes the target posture in the controller that operates the transfer robot 1. When the transfer robot 1 performs an actual operation, the controller controls the posture adjustment unit 40 in accordance with the stored driving amount. As a result, the inclination of the workpiece W caused by its own weight or the like is corrected, and the transfer robot 1 transports the workpiece W while the posture of the workpiece W is adjusted to approach the target posture. It should be noted that the inclination of the workpiece W may be detected by a sensor (for example, a camera, a gyro sensor, an acceleration sensor, or the like) and the controller may control the posture adjustment unit 40 so that the posture of the workpiece W approaches the target posture based on the detection value by the sensor at the stage of performing the actual work instead of the teaching stage.

Figure 3A:
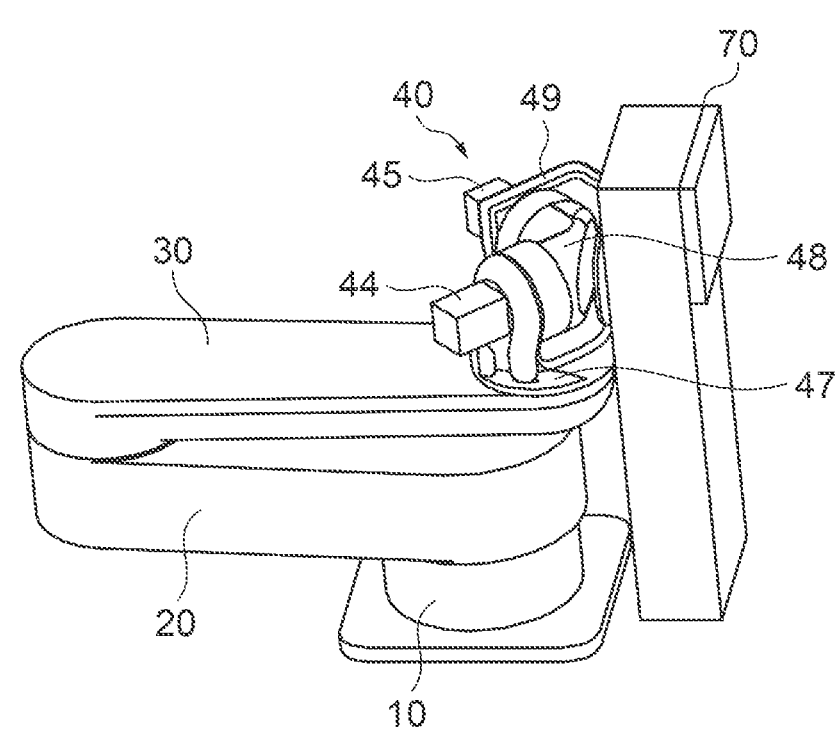
FIG. 3A and FIG. 3B are perspective views schematically illustrating an example of the posture adjustment unit and members around the posture adjustment unit.
Figure 3B:
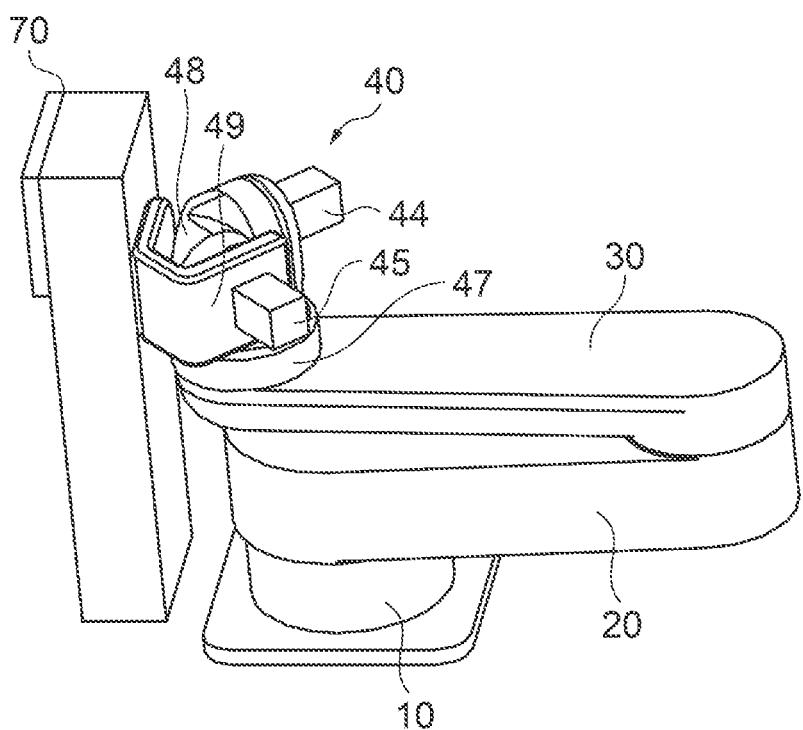
Figure 4A:
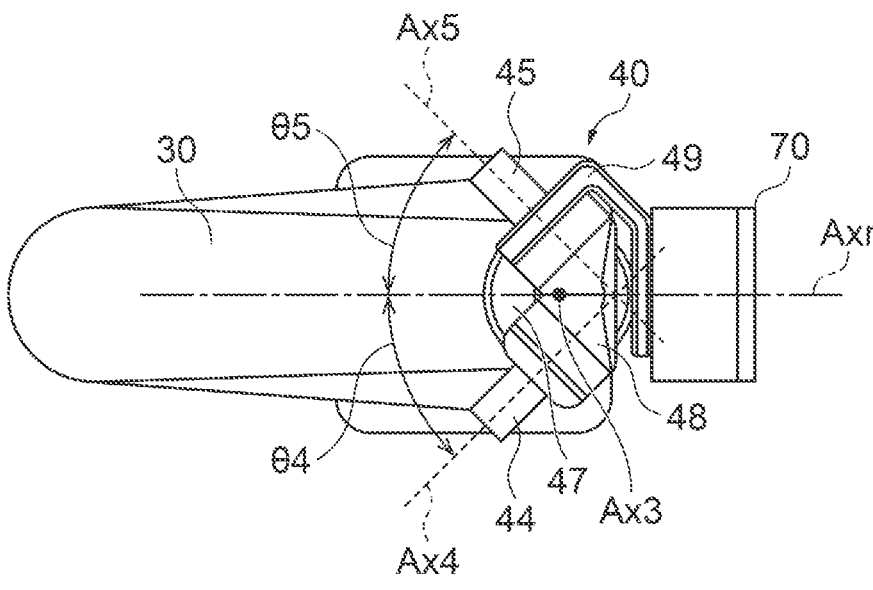
FIG. 4A is a top view schematically illustrating an example of the posture adjustment unit and members around the posture adjustment unit.

The posture adjustment unit 40 may be configured in any manner as long as it can adjust the posture of the workpiece W (for example, the inclination of the direction D1, or the inclinations of the direction D1 and the direction D2). As illustrated in FIGS. 3A, 3B, and 4A, the posture adjustment unit 40 includes, for example, a first adjustment unit (an example of "a first adjuster") 44 and a second adjustment unit (an example of "a second adjuster") 45. The first adjustment unit 44 rotates the arm distal end portion 70 about the fourth axis Ax4. The second adjustment unit 45 rotates the arm distal end portion 70 about the fifth axis Ax5. Each of the first adjustment unit 44 and the second adjustment unit 45 includes, for example, a motor and a reduction gear. The posture adjustment unit 40 rotates the arm distal end portion 70 around the first posture adjustment axis Axp and the second posture adjustment axis Axr by the rotation of the arm distal end portion 70 by the first adjustment unit 44 and the second adjustment unit 45.

The fourth axis Ax4 and the fifth axis Ax5 are set so as to intersect with each other.

The fourth axis Ax4 and the fifth axis Ax5 are axes included in the same plane which intersects the third axis Ax3, and may intersect each other so as to have an intersection point (common point). For example, the fourth axis Ax4 and the fifth axis Ax5 may be set to have an intersection point on the third axis Ax3 or may be set to have an intersection point at a position separated from the third axis Ax3. Each of the first posture adjustment axis Axp and the second posture adjustment axis Axr passes through an intersection point of the fourth axis Ax4 and the fifth axis Ax5.

The angle formed by the second posture adjustment axis Axr and the fourth axis Ax4 (hereinafter referred to as "angle $\theta 4$") is set to $\theta 4$.) is larger than 0° and smaller than 90° (+90°). As shown in FIG. 4A, the angle $\theta 4$ is an angle of the fourth axis Ax4 with respect to the second posture adjustment axis Axr when the second posture adjustment axis Axr is set to 0° in a plan view. In addition, in the circumference around the intersection point of the second posture adjustment axis Axr, the fourth axis Ax4, and the fifth axis Ax5, it is defined that the angle in the counterclockwise direction is positive and the angle in the clockwise direction is negative.

The angle formed by the second posture adjustment axis Axr and the fifth axis Ax5 (hereinafter referred to as "angle $\theta 5$") is set to $\theta 5$.) is larger than −90° and smaller than 0°. The angle $\theta 5$ is an angle of the fifth axis Ax5 with respect to the second posture adjustment axis Axr when the second posture adjustment axis Axr is set to 0° in a case where the arm distal end portion 70 is in the reference state (a state where driving by the first adjustment unit 44 and the second adjustment unit 45 is not performed) in a plan view. The absolute value of the angle $\theta 4$ and the absolute value of the angle $\theta 5$ may be substantially equal to each other or may be different from each other. Each of the absolute value of the angle $\theta 4$ and the absolute value of the angle $\theta 5$ may be 10° to 80°, 20° to 70°, or 30° to 60°. In one example, when the angle $\theta 4$ is 45°, the angle $\theta 5$ is −45°.

Figure 4B:
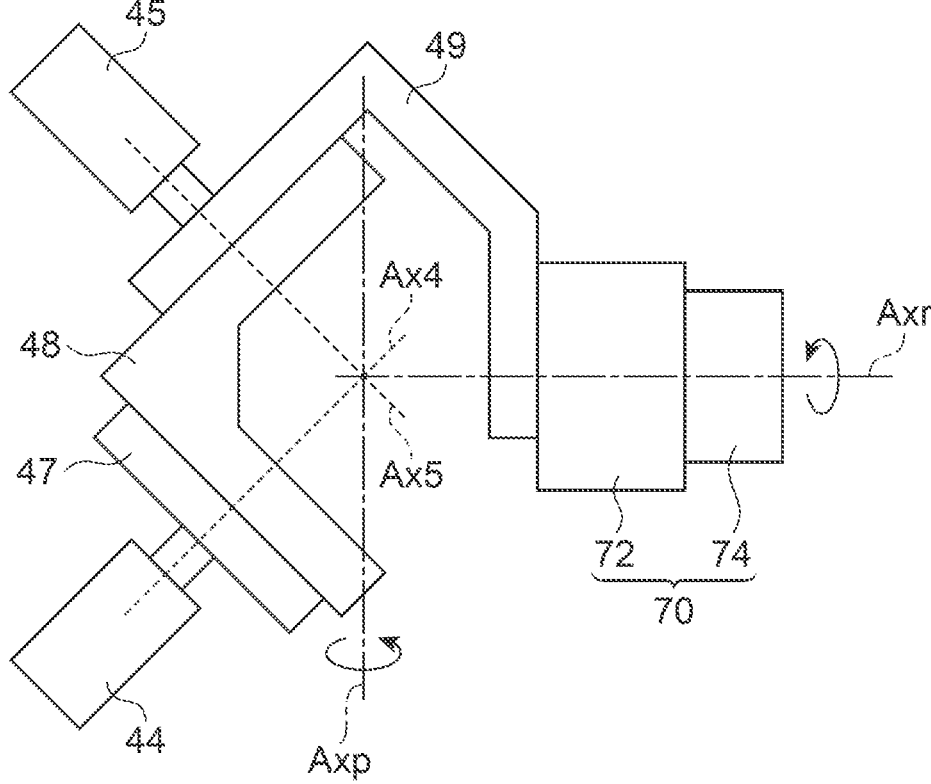
FIG. 4B is a schematic diagram for explaining an example of adjustment by the posture adjustment unit.

In FIG. 4B, the posture adjustment unit 40 shown in FIGS. 3A, 3B, and 4B and arm distal end portion 70 which is connected to the posture adjustment unit 40 are schematically illustrated in for the purpose of description. The posture adjustment unit 40 includes a posture adjustment base 47, a coupling member 48, and a coupling member 49. The posture adjustment base 47 is attached to the distal end portion 34 of the second arm 30 so as to be rotatable about the third axis Ax3. The coupling member 48 is attached to the posture adjustment base 47 so as to be rotatable about the fourth axis Ax4 with respect to the posture adjustment base 47. The coupling member 49 is attached to the coupling member 48 so as to be rotatable about the fifth axis Ax5 with respect to the coupling member 48. The arm distal end portion 70 (lifting base portion 72) is attached to the coupling member 49, and the workpiece holding unit 80 is attached to the movable portion 74 of the arm distal end portion 70.

When the first adjustment unit 44 rotates the coupling member 48 about the fourth axis Ax4, the coupling member 49, the arm distal end portion 70, and the workpiece holding unit 80 rotate about the fourth axis Ax4. The second adjustment unit 45 rotates coupling member 49 about fifth axis Ax5, arm distal end portion 70 and workpiece holding unit 80 rotate about fifth axis Ax5. The posture adjustment unit 40 generates a force (torque) for rotating the workpiece holding unit 80 about the first posture adjustment axis Axp and a force (torque) for rotating the workpiece holding unit 80 about the second posture adjustment axis Axr by the torque about the fourth axis Ax4 by the first adjustment unit 44 and the torque about the fifth axis Ax5 by the second adjustment unit 45.

Figure 5A:
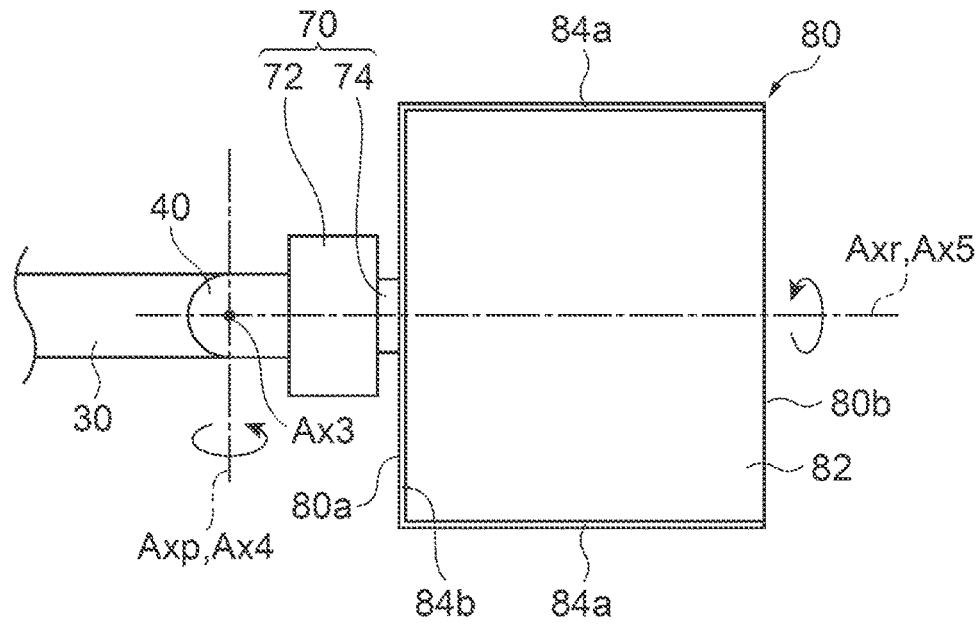
FIG. 5A is a top view schematically showing an example of the transfer robot.
Figure 5B:
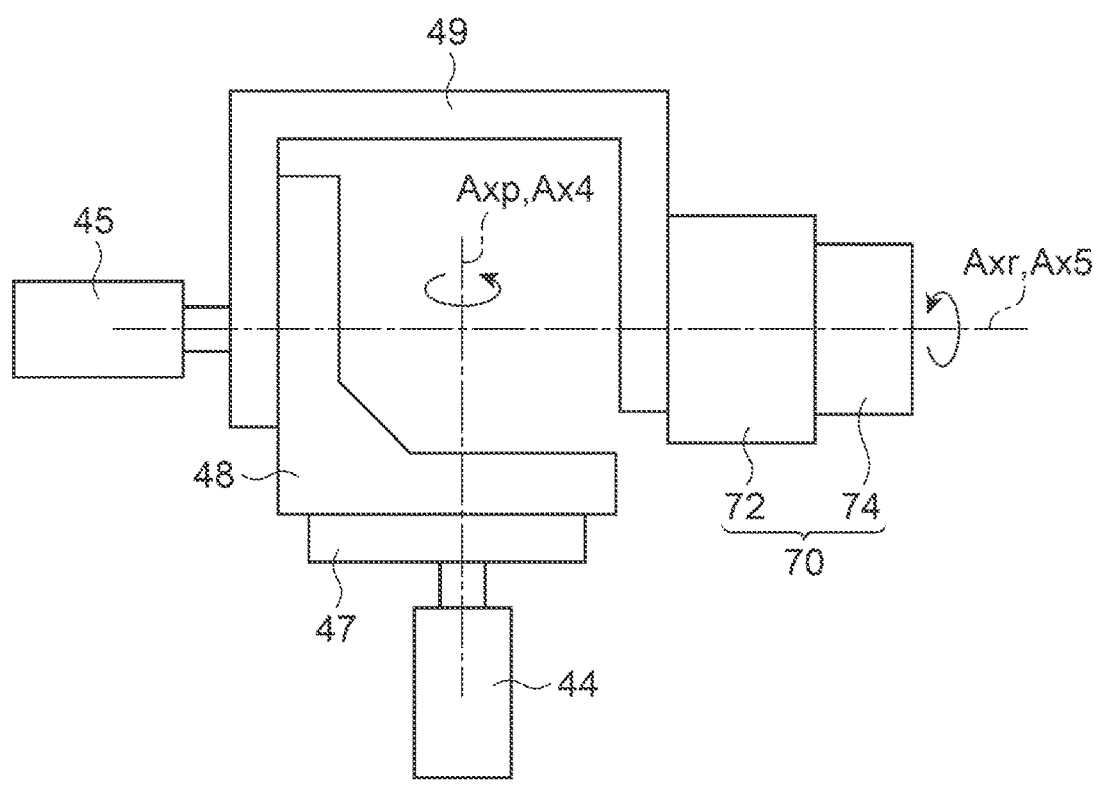
FIG. 5B is a schematic diagram for explaining an example of adjustment by the posture adjustment unit.

Unlike the posture adjustment unit 40 exemplified above, the posture adjustment unit 40 may rotate the arm distal end portion 70 around the first posture adjustment axis Axp by one actuator and rotate the arm distal end portion 70 around the second posture adjustment axis Axr by another actuator. As shown in FIGS. 5A and 5B, the first adjustment unit 44 may be provided such that the fourth axis Ax4 corresponds to the first posture adjustment axis Axp. The second adjustment unit 45 may be provided such that the fifth axis Ax5 corresponds to the second posture adjustment axis Axr. The posture adjustment unit 40 may be configured such that the angle of the fifth axis Ax5 with respect to the horizontal plane changes as the first adjustment unit 44 rotates about the fourth axis Ax4.

In the posture adjustment unit 40 illustrated in FIGS. 5A and 5B, only the first adjustment unit 44 may be provided without providing the second adjustment unit 45. That is, the posture adjustment unit 40 may rotate the arm distal end portion 70 around the first posture adjustment axis Axp without rotating the arm distal end portion 70 around the second posture adjustment axis Axr.

Figure 6A:
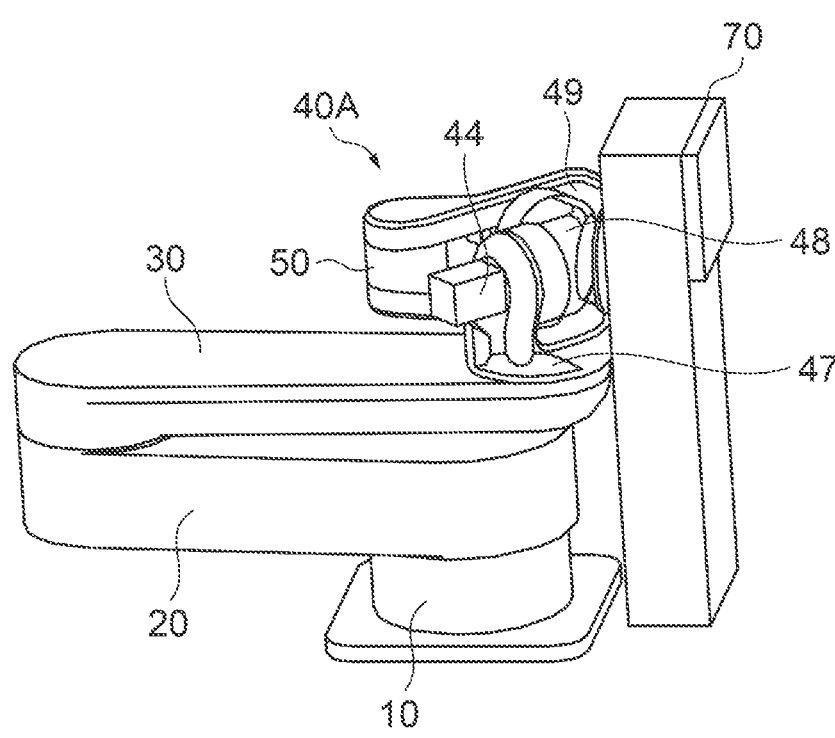
FIG. 6A and FIG. 6B are perspective views schematically illustrating an example of the posture adjustment unit and members around the posture adjustment unit.
Figure 6B:
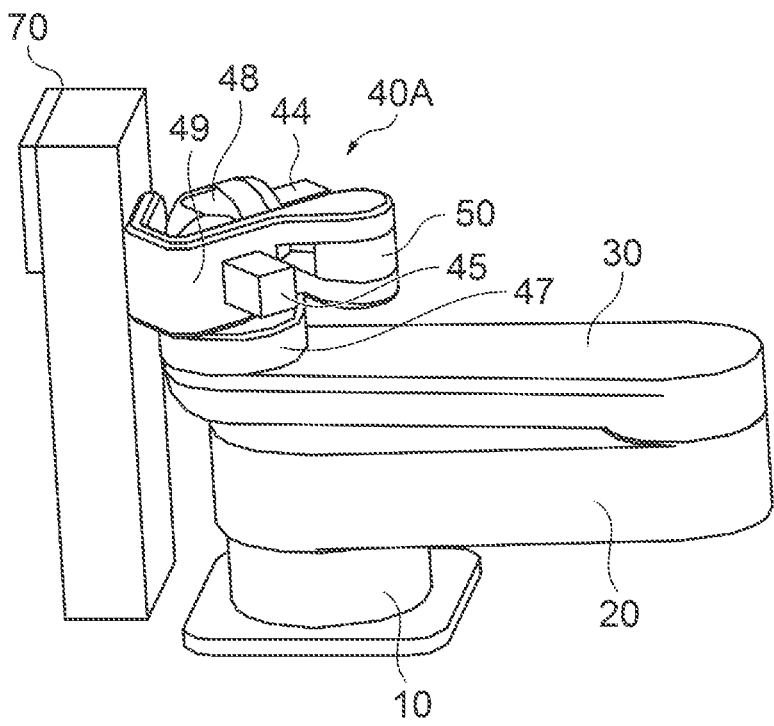
Figure 7A:
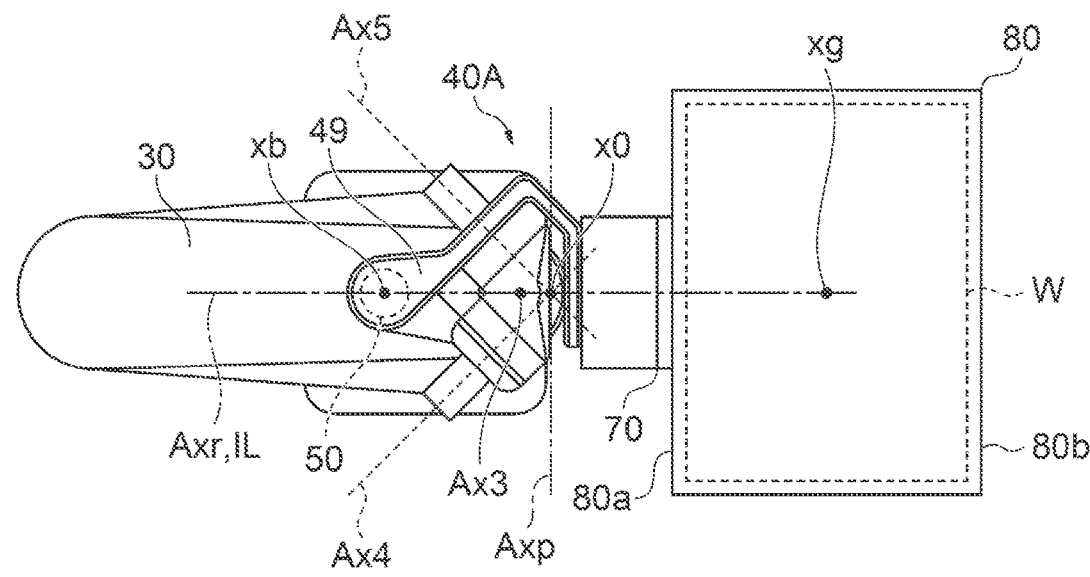
FIG. 7A is a top view schematically illustrating an example of the posture adjustment unit and members around the posture adjustment unit.

As illustrated in FIGS. 6A, 6B, and 7A, the transfer robot 1 may include a posture adjustment unit 40A instead of the posture adjustment unit 40. The posture adjustment unit 40A differs from the posture adjustment unit 40 in that the posture adjustment unit SL further includes a balancer member (an example of "a balancer") 50. The balancer member 50 is rotated about the first posture adjustment axis Axp by a force (hereinafter referred to as "correction force") acting against the own weight of the workpiece W. The balancer member 50 generates a correction force for reducing a moment (gravity load moment) generated by the self-weight of the workpiece W and the distance from the first posture adjustment axis Axp when the first posture adjustment axis Axp is used as a reference.

When the workpiece holding unit 80 holding the workpiece W is rotated about the first posture adjustment axis Axp to lift the end portion 80*b* which is the distal end, the posture adjustment unit 40 needs to generate a torque exceeding the moment due to the own weight of the workpiece W. When the arm distal end portion 70 is rotated about the first posture adjustment axis Axp to lift the end portion 80*b*, the balancer member 50 generates a correction force that reduces the torque that needs to be generated by the posture adjustment unit 40 (for example, the first adjustment unit 44 and the second adjustment unit 45, or the first adjustment unit 44).

As shown in FIG. 7A, when viewed from the vertical direction, the balancer member 50, the first posture adjustment axis Axp (the intersection of the first posture adjustment axis Axp and the virtual line IL), and the arm distal end portion 70 may be arranged in this order on the virtual line IL passing through the third axis Ax3. The virtual line IL is, for example, a virtual line extending along a direction extending toward the arm distal end portion 70 so as to be away from the third axis Ax3 and passing through the third axis Ax3 in a plan view. When the posture adjustment unit 40 rotates the workpiece holding unit 80 also about the second posture adjustment axis Axr, the virtual line IL corresponds to the second posture adjustment axis Axr in a plan view.

Figure 7B:
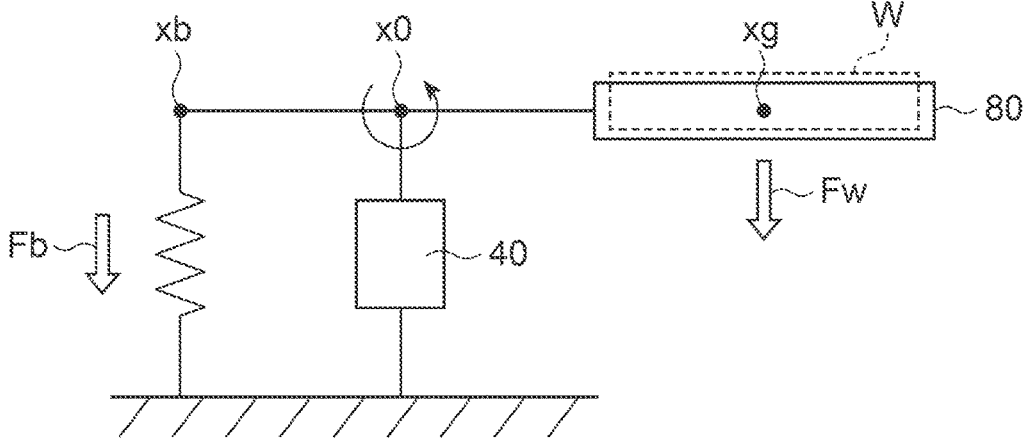
FIG. 7B is a schematic diagram for explaining an example of the function of the balancer member.

The workpiece holding unit 80 may hold the workpiece W such that the center of gravity of the workpiece W is located on the virtual line IL. In this case, on the virtual line IL, the balancer member 50, a point on the first posture adjustment axis Axp (for example, an intersection point of the fourth axis Ax4 and the fifth axis Ax5), and the center of gravity of the workpiece W are arranged in this order. In the top view shown in FIG. 7A, the x0 of the balancer member 50 is represented by "xb", the intersection of the virtual line IL and the first posture adjustment axis Axp is represented by "center", and the center of gravity of the workpiece W is represented by "xg". FIG. 7B is a schematic view for explaining the function of the balancer member 50.

The intersection point x0 means the origin of rotation about the first posture adjustment axis Axp. The center of gravity xg of the workpiece W is located horizontally away from the intersection x0 by a certain distance. The moment due to the own weight of the workpiece W can be obtained by multiplying the force Fw representing the own weight of the workpiece W by the shortest distance between the intersection point x0 and the center of gravity xg. The balancer member 50 is located on a side opposite to the center of gravity xg with respect to the intersection point x0. When the force Fb is applied to the arm distal end portion 70 and the like by the balancer member 50, the gravity moment (torque to be generated by the posture adjustment unit 40) can be reduced by a value obtained by multiplying the force Fb by the shortest distance between the intersection point x0 and the position xb.

The balancer member 50 is, for example, a coil spring, and generates the correction force (force Fb) by an elastic force of the spring. In one example, the posture adjustment base 47 and the coupling member 49 of the posture adjustment unit 40 are connected to each other via the balancer member 50. The balancer member 50 is configured to apply a downward force to the coupling member 49. The balancer member 50 may be configured in any manner as long as the balancer member 50 can reduce the moment caused by the weight of the workpiece W.

Unlike the example shown in FIG. 1 and the like, the posture adjustment unit 40 may be provided below the distal end portion 34 of the second arm 30. Unlike the example shown in FIG. 1 and the like, the proximal end 32 of the second arm 30 may be provided below the distal end portion 24 of the first arm 20. When the second arm 30 is arm 30 is positioned below the first arm 20, the posture adjustment unit 40 may be provided above the distal end portion 34 of the second arm 30 or may be provided below the distal end portion 34 of the second arm 30.

Unlike the example illustrated in FIG. 1 and the like, the lifting base portion 72 of the arm distal end portion 70 may be disposed at a height different from that of the first arm 20 and the second arm 30. The lowermost position of the lifting base portion 72 may be higher than the uppermost position of the second arm 30. At least a part of the movable region when the lifting base portion 72 is rotated about the third axis Ax3 may overlap the second arm 30 when viewed from the vertical direction.

Figure 8:
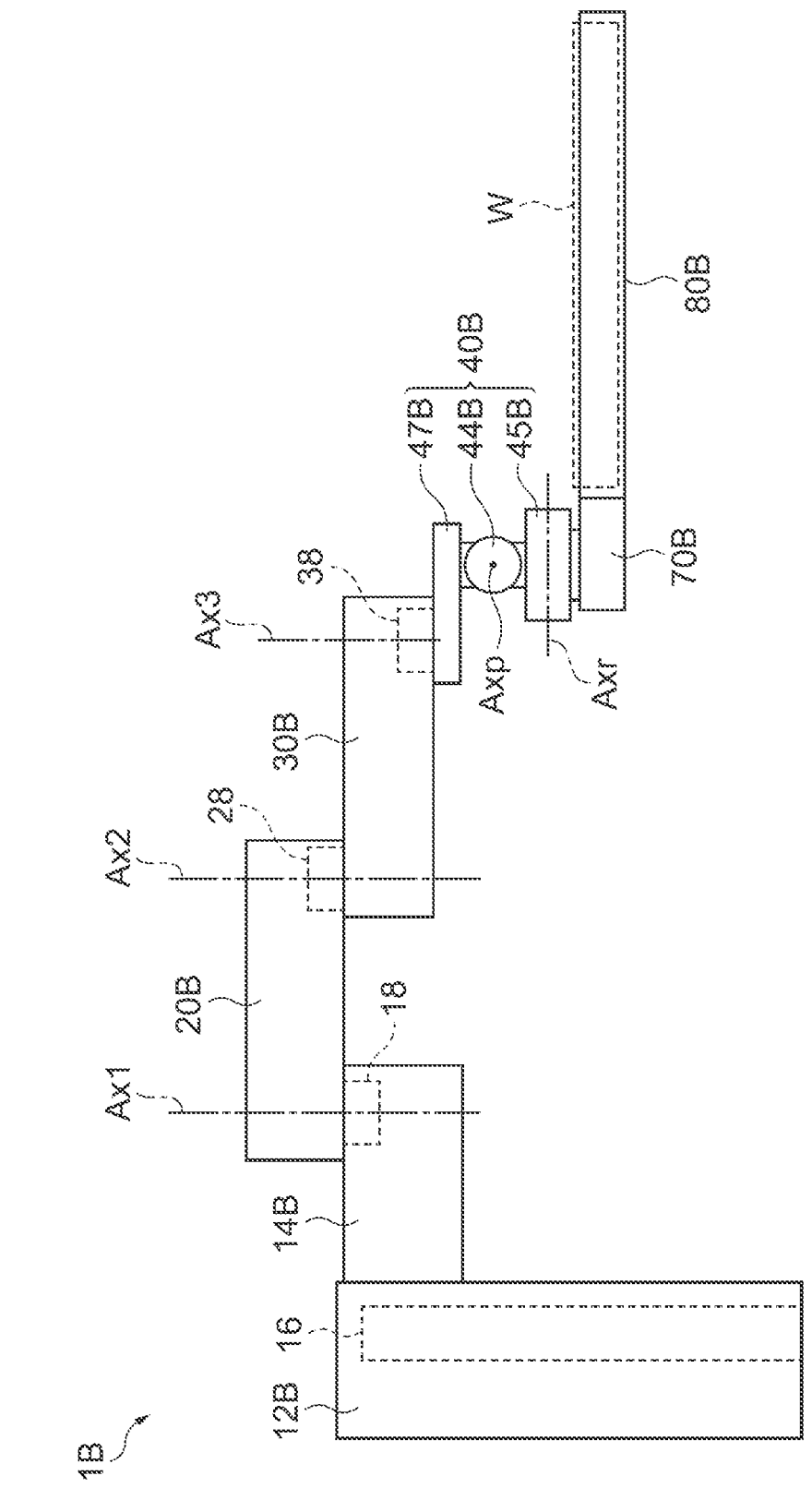
FIG. 8 is a side view schematically showing an example of the transfer robot.

Unlike the example shown in FIG. 1 and the like, a mechanism for raising and lowering the arm distal end portion 70 (workpiece W) may be provided between the base 10 and the first arm in the transfer robot 1. The transfer robot 1B shown in FIG. 8 includes a base 12B, an arm base 14B, a first arm 20B, a second arm 30B, an arm distal end portion 70B, a workpiece holding unit 80B, and a posture adjustment unit 40B.

The base 12B is fixed to a bottom surface, a wall surface, or the like, and the arm base 14B is moved up and down by the linear drive unit 16. The arm base 14B is provided on the base 12B so as to be movable up and down, and protrudes from the base 12B in a horizontal direction. The first arm 20B corresponds to the first arm 20 of the transfer robot 1 and is provided on the arm base 14B so as to rotate about a vertical first axis Ax1. The second arm 30B corresponds to the second arm 30 of the transfer robot 1, and is provided at the distal end portion of the first arm 20B so as to rotate about a vertical second axis Ax2.

The arm distal end portion 70B is provided at a distal end portion of the second arm 30B via an posture adjustment unit 40B so as to rotate about a vertical third axis Ax3. The workpiece holding unit 80B is supported by (connected to) the arm distal end portion 70B and holds the workpiece W at a position away from the third axis Ax3.

The posture adjustment unit 40B is provided between the second arm 30B and the arm distal end portion 70B. The posture adjustment unit 40B may be provided below the second arm 30B. The posture adjustment unit 40B rotates the workpiece holding unit 80B at least around the first posture adjustment axis Axp. The posture adjustment unit 40B may rotate the workpiece holding unit 80B around the first posture adjustment axis Axp and the second posture adjustment axis Axr. In the transfer robot 1B, the first posture adjustment axis Axp intersects both the third axis Ax3 and a direction extending to the arm distal end portion 70B so as to be away from the third axis, and the second posture adjustment axis Axr intersects both the first posture adjustment axis Axp and the third axis Ax3.

In one example, the posture adjustment unit 40B includes a posture adjustment base 47B connected to the distal end part of the second arm 30B, and a first adjustment unit 44B and a second adjustment unit 45B vertically arranged between the posture adjustment base 47B and the arm distal end portion 70B. The first adjustment unit 44B receives supply of electric power and rotates the workpiece holding unit 80B about a first posture adjustment axis Axp corresponding to the fourth axis Ax4 (not illustrated). The second adjustment unit 45B is supplied with electric power to rotate the workpiece holding unit 80B about a second posture adjustment axis Axr corresponding to the fifth axis Ax5 (not illustrated). The arrangement relationship between the first posture adjustment axis Axp and the second posture adjustment axis Axr is not limited. The first posture adjustment axis Axp and the second posture adjustment axis Axr may be provided at the same height, or the second posture adjustment axis Axr may be provided above the first posture adjustment axis Axp. The first adjustment unit 44B and the second adjustment unit 45B may be provided so as to rotate the workpiece holding unit 80B about the first posture adjustment axis Axp and the second posture adjustment axis Axr by combining the rotation about the fourth axis Ax4 that does not coincide with the first posture adjustment axis Axp and the rotation about the fifth axis Ax5 that does not coincide with the second posture adjustment axis Axr. Furthermore, in order to generate a correction force for reducing a moment (gravity load moment) generated by the self-weight of the workpiece W and the distance from the first posture adjustment axis Axp, the balancer member 50 may be provided in the transfer robot 1B.

The transfer robot 1, 1B may be provided with a horizontally extending arm other than the first arm 20, 20B and the second arm 30, 30B. In one of the various examples described above, at least some of the matters described in the other examples may be combined.

SUMMARY

The present disclosure includes configurations described in the following (1) to (18).

(1) The transfer robot 1, 1B includes first arm 20, 20B provided to rotate about a first axis Ax1 and extending in a direction away from the first axis Ax1, second arm 30, 30B provided on first arm 20, 20B to rotate about a vertical second axis Ax2 and extending in a direction away from the second axis Ax2, arm distal end portion 70, 70B connected to the second arm 30, 30B to rotate about a vertical third axis Ax3 and configured to support a workpiece holding unit 80 holding the workpiece W, and posture adjustment unit 40, 40A, 40B configured to rotate the workpiece W about a first posture adjustment axis Axp which intersects both the third axis and the direction extending to the arm distal end portion 70, 70B to move away from the third axis Ax3.

Since the scalar type multi-joint arm (horizontal multi-joint arm) has a degree of freedom in the horizontal direction, the scalar type multi-joint arm has high rigidity in the vertical direction and has a structure that is not easily bent. However, when the weight of the workpiece is large, deflection may occur such that the distal end of the multi-joint arm sinks in accordance with the moment rigidity of the joint portion of the arm or the rigidity of the arm itself. As a result, the posture of the workpiece held by the distal end of the multi-joint arm is not maintained at the target posture (for example, horizontal), and the accuracy of the work including the conveyance may decrease. On the other hand, in the transfer robot 1, 1B, since the workpiece W is rotatable about the first posture adjustment axis Axp, it is possible to correct the angle of the workpiece W about the first posture adjustment axis Axp, and the influence of the bending of the articulated arm caused by the weight of the workpiece W can be reduced. Therefore, work including conveyance of the workpiece W can be performed in a state in which the posture of the workpiece W is held at a target posture (for example, horizontal) around the first posture adjustment axis Axp. Therefore, the transfer robot 1 or 1B is useful for improving the working accuracy.

(2) The transfer robot 1, 1B according to (1) as described above, wherein a movable range of the workpiece W about the first posture adjustment axis Axp by the posture adjustment unit 40, 40A, 40B are within ±30°. The movable range is a range sufficient to adjust the posture of the workpiece W. For example, in the posture adjustment unit 40A, the balancer member 50 designed and installed in accordance with the movable range can be simplified, miniaturized, or lightened.

(3) The transfer robot 1, 1B according to (1) or (2) as described above, wherein the posture adjustment unit 40, 40A, 40B are configured to further rotate the workpiece W about a second posture adjustment axis Axr which intersects both the first posture adjustment axis Axp and the third axis Ax3.

In this case, the work including the conveyance of the workpiece W can be performed in a state where the posture of the workpiece W around the second posture adjustment axis Axr is also held at a target posture (for example, horizontal). Therefore, it is further useful for improving the working accuracy.

(4) The transfer robot 1, 1B according to (3) as described above, wherein a movable range of the workpiece W around the second posture adjustment axis Axr by the posture adjustment unit 40, 40A, 40B are within ±30°. The movable range is a range sufficient to adjust the posture of the workpiece W. For example, in the posture adjustment unit 40A, the balancer member 50 designed and installed in accordance with the movable range can be simplified, miniaturized, or lightened.

(5) The transfer robot 1, vid according to (3) or (4) as described above, wherein the posture adjustment unit 40, 40A, 40B are provided between the second arm 30, 30B and the arm distal end portion 70, 70B, the posture adjustment unit 40, 40A, 40B include first adjustment unit 44, 44B configured to rotate the arm distal end portion 70, 70B about the fourth axis and a second adjustment unit 45, 45B configured to rotate the arm distal end portion 70, 70B about the fifth axis Ax5, and the fourth axis Ax4 and the fifth axis Ax5 are included in the same plane which intersects the third axis Ax3 and intersects each other to have an intersection point.

In this case, the posture of the workpiece W about the first posture adjustment axis Axp and the second posture adjustment axis Axr can be appropriately adjusted.

(6) The transfer robot 1 or 1B according to (5) as described above, in which an angle between the fourth axis Ax4 and the second posture adjustment axis Axr is larger than 0° and smaller than 90°, and an angle between the fifth axis Ax5 and the second posture adjustment axis Axr is larger than −90° and smaller than 0°. In this case, the load torque per motor can be reduced or the torque applied to the workpiece W about the first posture adjustment axis Axp can be amplified as compared with the case where the workpiece W is rotated about the first posture adjustment axis Axp by a single motor.

(7) The transfer robot 1, 1B according to (5) as described above, wherein the fourth axis Ax4 corresponds to the first posture adjustment axis Axp, and the fifth axis Ax5 corresponds to the second posture adjustment axis Axr.

In this case, the attitudes about the first posture adjustment axis Axp and the second posture adjustment axis Axr can be adjusted independently of each other.

(8) The transfer robot 1 according to any one of (1) to (7) as described above, further including a base 10 fixed at a predetermined position, wherein the proximal end 22 of the first arm 20 is provided on the base 10, the posture adjustment unit 40, 40A is provided between the second arm 30 and the arm distal end portion 70, and the arm distal end portion 70 includes a lifting base portion 72 connected to the posture adjustment unit 40, 40A, a movable portion 74 supporting the workpiece holding unit 80 and provided on the lifting base portion 72 so as to move along a direction in which the lifting base portion 72 extends, and a linear motion driving unit 78 driving the movable portion 74 along the direction in which the lifting base portion 72 extends.

The size of the mechanism for raising and lowering the portion including the workpiece holding unit 80 depends on the weight of the portion raised and lowered by the raising and lowering mechanism. In the above configuration, compared to a case where the lifting mechanism is provided between the base and the first arm, it is possible to reduce the weight of a portion lifted and lowered by the lifting mechanism. Therefore, the structure of the portion supporting from the first arm to the workpiece distal end portion is simplified, and the transfer robot 1 as a whole can be downsized.

(9) The transfer robot 1 according to (8) as described above, in which the movable portion 74 is capable of supporting the workpiece holding unit 80 such that the workpiece holding unit 80 is disposed on a side of the arm distal end portion 70. In this case, even when the workpiece holding unit 80 is raised and lowered, the workpiece W held by the arm distal end portion 70 is prevented from interfering with the lifting base portion 72 of the arm distal end portion 70. Therefore, it is possible to increase the movable region of the workpiece W in the direction in which the lifting base portion 72 extends.

(10) The transfer robot 1 according to (9) as described above, in which the lifting base portion 72 is connected to the second arm 30 via the posture adjustment unit 40 in a state of being disposed at a position separated from the third axis Ax3.

In this case, the lifting base portion 72 can be extended without interfering with the second arm 30. Therefore, it is possible to increase the movable region of the workpiece W in the direction in which the lifting base portion 72 extends.

(11) The transfer robot 1, 1B according to any one of (1) to (10) as described above, further including a balancer member 50 configured to generate a correction force about the first posture adjustment axis Axp against the weight of the workpiece W.

In this case, the torque for rotating the workpiece W about the first posture adjustment axis Axp can be reduced. Therefore, it is possible to reduce the size or weight of the motors included in the posture adjustment unit 40A and 40B.

(12) The transfer robot 1, 1B according to (11) as described above, in which the balancer member 50 is disposed such that the balancer member 50, the first posture adjustment axis Axp, and the workpiece holding unit 80, 80B are arranged in this order on the virtual line IL passing through the third axis Ax3 when viewed from the direction in which the third axis Ax3 extends.

In this case, the torque for rotating the workpiece W about the first posture adjustment axis Axp can be reduced.

(13) The transfer robot 1 according to any one of (1) to (7) as described above, in which the posture adjustment unit 40 or 40A is disposed at a height different from that of the first arm 20 in the direction in which the third axis Ax3 extends.

In this case, when the first arm 20 and the second arm 30 are disposed so as to overlap each other, it is possible to avoid interference between the posture adjustment unit 40 or 40A and the first arm 20. Therefore, it is possible to increase the movable range of the first arm 20 and the second arm 30.

(14) The transfer robot 1 according to (13) as described above, in which the proximal end 32 of the second arm 30 is provided on the distal end portion 24 of the first arm 20, and the posture adjustment unit 40 or 40A is provided on the second arm 30. In this case, when the first arm 20 and the second arm 30 are disposed so as to overlap each other, it is possible to more reliably avoid interference between the posture adjustment unit 40, 40A and the first arm 20.

(15) The transfer robot 1 according to (14) as described above, further comprising a base 10 fixed at a predetermined position, wherein the proximal end 22 of the first arm 20 is provided on the base 10, the posture adjustment unit 40, 40A are provided between the second arm 30 and the arm distal end portion 70, and the arm distal end portion 70 includes a lifting base portion 72 connected to the posture adjustment unit 40, 40A, a movable portion 74 supporting the workpiece holding unit 80 and provided on the lifting base portion 72 to move along the extending direction of the lifting base portion 72, and a linear motion driving unit 78 driving the movable portion 74 along the extending direction of the lifting base portion 72. In this case, the movable region of the movable portion 74 in the direction in which the lifting base portion 72 extends to the same height as at least a portion of the first arm 20 and at least a portion of the second arm 30. Therefore, the workpiece holding unit 80 that supports the workpiece W can be moved to the same height as the first arm 20 or the second arm 30.

(16) The transfer robot 1, 1B according to any one of (1) to (15), further including a workpiece holding unit 80, 80B, in which the workpiece holding unit 80, 80B are configured to support the workpiece W from below at a position away from the third axis Ax3.

(17) The transfer robot 1, 1B according to any one of (1) to (15) as described above, further including workpiece holding units 80, 80B, in which a load capacity is equal to or greater than 300 kg. In this case, the degree of bending of the multi-joint arm due to the self-weight of the workpiece W may increase. It is more useful to adjust the attitude of the workpiece W about the first posture adjustment axis Axp.

(18) The transfer robot 1, 1B according to any one of (1) to (15) as described above, further including workpiece holding units 80, 80B, in which the workpiece W includes a battery module for traveling of an electric automobile.

In this case, the degree of bending of the articulated arm due to the own weight of the workpiece W can be increased. Therefore, it is more useful to adjust the posture of the workpiece W about the first posture adjustment axis Axp.

The term "comprise" and its variations are intended to mean open-ended terms, not excluding any other elements and/or components that are not recited herein. The same applies to the terms "include", "have", and their variations.

The component suffixed with a term such as "member", "portion", "part", "element", "body", and "structure" is intended to mean that there is a single such component or a plurality of such components.

Ordinal terms such as "first" and "second" are merely used for distinguishing purposes and there is no other intention (such as to connote a particular order) in using ordinal terms. For example, the mere use of "first element" does not connote the existence of "second element"; otherwise, the mere use of "second element" does not connote the existence of "first element".

Approximating language such as "approximately", "about", and "substantially" may be applied to modify any quantitative representation that could permissibly vary without a significant change in the final result obtained. All of the quantitative representations recited in the present application shall be construed to be modified by approximating language such as "approximately", "about", and "substantially".

The phrase "at least one of A and B" is intended to be interpreted as "only A", "only B", or "both A and B".

Obviously, numerous modifications and variations of the present disclosure are possible in light of the above teachings. It is therefore to be understood that within the scope of the appended claims, the present disclosure may be practiced otherwise than as specifically described herein.

What is claimed is:

1. A transfer robot comprising:
a first arm provided rotatably around a first axis which extends along a vertical direction;
a second arm connected to the first arm rotatably around a second axis which extends along the vertical direction;
an arm distal end portion which is configured to be connected to a workpiece holder to hold a workpiece and which is connected to the second arm rotatably around a third axis which extends along the vertical direction; and
a posture adjuster configured to rotate the workpiece around a first posture adjustment axis which intersects both the third axis and a direction extending toward the arm distal end portion away from the third axis;
wherein the posture adjuster is configured to further rotate the workpiece around a second posture adjustment axis which intersects both the first posture adjustment axis and the third axis;
wherein the posture adjuster is provided between the second arm and the arm distal end portion,
wherein the posture adjuster comprises:
a first adjuster configured to rotate the arm distal end portion around a fourth axis, and
a second adjuster configured to rotate the arm distal end portion around a fifth axis, and
wherein the fourth axis and the fifth axis intersect each other so as to have an intersection point and are on a plane which intersects the third axis.

2. The transfer robot according to claim 1, wherein a movable range of the workpiece around the first posture adjustment axis by the posture adjuster is within ±30°.

3. The transfer robot according to claim 1, wherein a movable range of the workpiece around the second posture adjustment axis by the posture adjuster is within ±30°.

4. The transfer robot according to claim 1,
wherein an angle between the fourth axis and the second posture adjustment axis is larger than 0° and smaller than 90°, and
wherein an angle between the fifth axis and the second posture adjustment axis is larger than −90° and smaller than 0°.

5. The transfer robot according to claim 1,
wherein the fourth axis corresponds to the first posture adjustment axis, and
wherein the fifth axis corresponds to the second posture adjustment axis.

6. The transfer robot according to claim 1, further comprising:
a base fixed at a predetermined position,
wherein a proximal end of a first arm is provided on the base, wherein the posture adjuster is provided between the second arm and the arm distal end portion, and
wherein the arm distal end portion comprises
a lifting base portion connected to the posture adjuster,
a movable portion to support the workpiece holder and provided in the lifting base portion so as to move along a direction in which the lifting base portion extends, and
a linear motion driving unit to drive the movable portion along the direction in which the lifting base portion extends.

7. The transfer robot according to claim 6,
wherein the movable portion is configured to support the workpiece holder such that the workpiece holder is disposed on a side of the arm distal end portion.

8. The transfer robot according to claim 7,
wherein the lifting base portion is connected to the second arm via the posture adjuster such that the lifting base portion is positioned away from the third axis.

9. The transfer robot according to claim 1, wherein the posture adjuster is disposed at a height different from a height of the first arm in a direction in which the third axis extends.

10. The transfer robot according to claim 9,
wherein the second arm is connected to the first arm such that the second arm is provided above the first arm, and
wherein the posture adjuster is provided on the second arm.

11. The transfer robot according to claim 10, further comprising:
a base fixed at a predetermined position,
wherein the proximal end of the first arm is provided on the base,
wherein the posture adjuster is provided between the second arm and the arm distal end portion,
wherein the arm distal end portion comprises
a lifting base portion connected to the posture adjuster,
a movable portion to support the workpiece holder and provided in the lifting base portion so as to move along a direction in which the lifting base portion extends, and
a linear motion driving unit to drive the movable portion along the direction in which the lifting base portion extends,
wherein the lifting base portion is connected to the second arm via the posture adjuster in a state in which the lifting base portion is positioned away from the third axis, and
wherein at least a portion of the lifting base portion is located at a same height as at least a portion of the first arm and at least a portion of the second arm in the direction in which the third axis extends.

12. The transfer robot according to claim 1, further comprising:
the workpiece holder configured to support the workpiece from below at a position away from the third axis.

13. The transfer robot according to claim 1, further comprising:
the workpiece holder, and
wherein the transfer robot has a carrying weight equal to or more than 300 kg.

14. The transfer robot according to claim 1, further comprising:
the workpiece holder, and
wherein the workpiece includes a battery module for traveling of an electric vehicle.

15. A transfer robot comprising:

a first arm provided rotatably around a first axis which extends along a vertical direction;

a second arm connected to the first arm rotatably around a second axis which extends along the vertical direction;

a posture adjuster connected to the second arm rotatably around a third axis which extends along the vertical direction; and an arm distal end portion fixed to the posture adjuster and connected to a workpiece holder to hold a workpiece; and the posture adjuster being configured to rotate the workpiece holder around a first posture adjustment axis which intersects both the third axis and a direction extending toward the arm distal end portion away from the third axis;

wherein the posture adjuster is configured to further rotate the workpiece around a second posture adjustment axis which intersects both the first posture adjustment axis and the third axis;

wherein the posture adjuster is provided between the second arm and the arm distal end portion, wherein the posture adjuster comprises:

a first adjuster configured to rotate the arm distal end portion around a fourth axis, and a second adjuster configured to rotate the arm distal end portion around a fifth axis, and wherein the fourth axis and the fifth axis intersect each other so as to have an intersection point and are on a plane which intersects the third axis.

\* \* \* \* \*